US012787850B2

(12) United States Patent
Guillon et al.

(10) Patent No.: US 12,787,850 B2
(45) Date of Patent: Nov. 3, 2026

(54) SEMICONDUCTOR POWER MODULE AND METHOD FOR MANUFACTURING A SEMICONDUCTOR POWER MODULE

(71) Applicant: Hitachi Energy Ltd, Zürich (CH)

(72) Inventors: David Guillon, Vorderthal (CH); Fabian Mohn, Ennetbaden (CH)

(73) Assignee: HITACHI ENERGY LTD, Zürich (CH)

( * ) Notice: Subject to any disclaimer, the term of this patent is extended or adjusted under 35 U.S.C. 154(b) by 382 days.

(21) Appl. No.: 18/556,641

(22) PCT Filed: Mar. 10, 2022

(86) PCT No.: PCT/EP2022/056135

§ 371 (c)(1),
(2) Date: Oct. 20, 2023

(87) PCT Pub. No.: WO2022/223199

PCT Pub. Date: Oct. 27, 2022

(65) Prior Publication Data

US 2024/0186199 A1 Jun. 6, 2024

(30) Foreign Application Priority Data

Apr. 21, 2021 (EP) .................................... 21169660

(51) Int. Cl.

| | |
|---|---|
| ***H10W 74/10*** | (2026.01) |
| ***H10W 70/40*** | (2026.01) |
| ***H10W 74/01*** | (2026.01) |
| ***H10W 74/47*** | (2026.01) |

(52) U.S. Cl.
CPC ........ *H10W 74/111* (2026.01); *H10W 70/466* (2026.01); *H10W 74/016* (2026.01); *H10W 74/47* (2026.01)

(58) Field of Classification Search
CPC ... H01L 23/28–3192; H01L 21/56–568; H01L 2924/181–186; H10W 74/10–129
See application file for complete search history.

(56) References Cited

U.S. PATENT DOCUMENTS

| | | | | |
|---|---|---|---|---|
| 2006/0079027 | A1 | 4/2006 | Yamada et al. | |
| 2011/0049701 | A1 | 3/2011 | Miyagawa | |
| 2013/0010440 | A1 * | 1/2013 | Saito .................. | H10W 74/476 361/752 |

(Continued)

FOREIGN PATENT DOCUMENTS

| | | | |
|---|---|---|---|
| CN | 1619777 | A | 5/2005 |
| CN | 101383296 | A | 3/2009 |

(Continued)

*Primary Examiner* — Christine S. Kim
*Assistant Examiner* — Cole Leon Lindsey
(74) *Attorney, Agent, or Firm* — PROCOPIO, CORY, HARGREAVES & SAVITCH LLP

(57) ABSTRACT

A semiconductor power module for a semiconductor device comprises a leadframe or substrate and a resin body that is coupled to the leadframe or substrate. The resin body includes at least a first resin element and a second resin element, wherein a resin material of the first resin element is different from a resin material of the second resin element. The resin elements are configured such that they are separated in part at least with respect to surface areas facing each other by means of a recess.

20 Claims, 4 Drawing Sheets

(56) References Cited

U.S. PATENT DOCUMENTS

Figure 1:
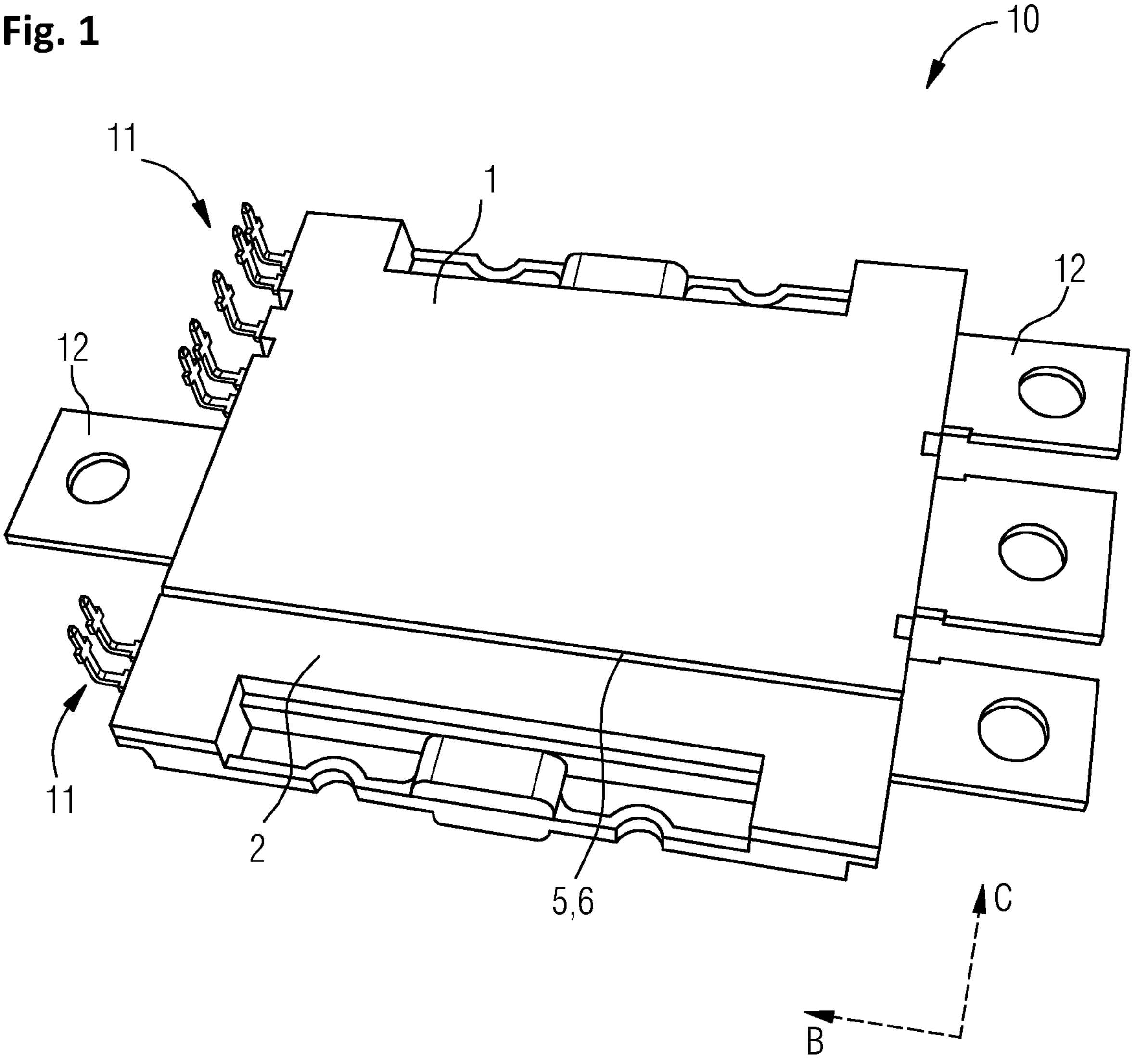

| | | | | |
|---|---|---|---|---|
| 2018/0226385 | A1 | 8/2018 | Nakabayashi et al. | |
| 2019/0157190 | A1* | 5/2019 | Fuergut ............... | H10W 70/048 |
| 2021/0225740 | A1* | 7/2021 | Sannai ................ | H10W 40/255 |

FOREIGN PATENT DOCUMENTS

| | | | |
|---|---|---|---|
| CN | 101552244 | A | 10/2009 |
| CN | 101783337 | A | 7/2010 |
| CN | 201655801 | U | 11/2010 |
| CN | 102754205 | A | 10/2012 |
| JP | H01-115255 | U | 8/1989 |
| JP | 2003-068976 | A | 3/2003 |
| JP | 2006-324401 | A | 11/2006 |
| JP | 2007-59536 | A | 3/2007 |
| JP | 2007-299964 | A | 11/2007 |
| JP | 2009-252838 | A | 10/2009 |
| JP | 2011-222684 | A | 11/2011 |
| JP | 2015-002245 | A | 1/2015 |
| JP | 2018-129434 | A | 8/2018 |
| WO | 2017/138402 | A1 | 8/2017 |

* cited by examiner

SEMICONDUCTOR POWER MODULE AND METHOD FOR MANUFACTURING A SEMICONDUCTOR POWER MODULE

The present application is a national stage entry of International Patent Application No. PCT/EP2022/056135, filed on Mar. 10, 2022, which claims priority to European Patent Application No. 21169660.4, filed on Apr. 21, 2021, the disclosures of which are hereby incorporated herein by reference as if set forth in full.

The present disclosure is related to a semiconductor power module and a method for manufacturing a semiconductor power module for a semiconductor device. The present disclosure is further related to a corresponding semiconductor device.

Document US 2013/010440 A1 discloses a power module invented for easy manufacturing and fatigue reduction at a soldered portion, and a method for manufacturing the same. The power module comprises a substrate where electronic parts are mounted by soldering, and a mold case housing the substrate and including bus bars for electrical connection with an external apparatus.

Document US 2019/157190 A1 discloses a semiconductor device package including a lead frame, a first encapsulated power semiconductor device mounted on a first part of the lead frame and a second encapsulated power semiconductor device mounted on a second part of the lead frame.

A commonly used technology for the encapsulation of small integrated circuits used for low voltage applications is transfer molding, where chips are joined to a leadframe or substrate and encapsulated in a package body. Thereby, a well-suited mold compound must be chosen to fulfil given requirements, which may contradict to each other. In this respect, it is a challenge to provide a mechanically stable power package with reliable functionality.

Embodiments of the disclosure relate to a mechanically stable semiconductor power module with reliable functioning that contributes to an enhanced module life. Embodiments of the disclosure also relate to a corresponding semiconductor device and a manufacturing method for such a semiconductor power module.

These objects are achieved by the subject-matter of the independent claims. Further developments and embodiments are described in the corresponding dependent claims.

According to an embodiment, a semiconductor power module for a semiconductor device comprises a leadframe or substrate and a resin body coupled to the leadframe or substrate. The resin body comprises at least a first resin element and a second resin element, wherein a resin material of the first resin element is different from a resin material of the second resin element. The first and second resin elements are arranged laterally adjacent to each other with respect to a lateral direction of the semiconductor power module. Moreover, the first resin element and the second resin element are separated in part at least with respect to surface areas facing each other by means of a recess. Such a recess can be formed as a penetrating gap between the resin elements such that the entire surface areas facing each other are separated from each other. Alternatively, the recess can be formed as a groove such that a predetermined portion of the surface areas facing each other are separated from each other. The gap and/or the groove can have a width of 0.5 mm or more with respect to a lateral direction of the semiconductor power module.

By use of the described structure a semiconductor power module is feasible that enables reliable functioning and an enhanced module life even for use in high voltage power module applications, for example for a voltage of at least 0.5 kV, for example. The specifically introduced one or more recesses form stress relief structures between several parts of different resin materials of a resin sealed semiconductor power package.

The leadframe or substrate is configured to realize a solderable metal structure inside a chip package that carry signals from the die to the outside, for example. It can also serve as mechanical support for a given arrangement of chips, integrated circuits and/or other discrete devices. The resin elements are formed on an upper surface of the leadframe or substrate with respect to a stacking direction perpendicular to the lateral directions which span the main plane of extent of the semiconductor power module.

According to an embodiment of the semiconductor power module at least one of the resin material of the first resin element or the second resin element comprises a thermosetting resin. Alternatively or additionally, at least one of the resin material of the first resin element or the second resin element comprises a potting resin.

The resin elements can realize a respective encapsulation and the described semiconductor power module may be manufactured using a frame mounted to a baseplate, wherein the structure according to the resin body are filled with dielectric gel or potting resin, for example, to form the first and/or the second resin elements. The described semiconductor power module is applicable to be used for automotive applications, for example, and can comprise one or more of the following:

- Large package or resin bodies of up to 80 mm side length and more than 10 mm body thickness
- Power terminals made of thick copper
- Encapsulation of insulating substrates and heatsinks having a backside typically exposed from package body
- High electric current and voltage (partly higher than 1 kV)
- Leak-tight mounting to cooler for liquid cooling
- Harsh environmental conditions e.g. in automotive applications.

According to a further embodiment the semiconductor power module comprises at least one of a filling or a coating inside at least one of the recess to fill the penetrating gap or the groove or to cover a surface area of the first and/or the second resin element which limits the gap or the groove. Such a filling or coating can comprise an elastic and/or protective material, e.g. a water repellent material, to improve a tightness of the resin body and the semiconductor power module against humidity or hazardous gases.

The resin body of the described semiconductor power module can further comprise a third resin element with a resin material that is different from the resin material of at least one of the first resin element or the second resin element and wherein the first, the second and the third resin elements all are separated in part at least with respect to surface areas facing each other by means of a recess, respectively.

It is a recognition in connection with the present disclosure that conventional power packages usually feature an encapsulation prepared by transfer molding of a homogeneous mold body made from one single mold compound. In view of a relatively large size of a transfer molded power package it might be difficult to address different local requirements for the best behaviour of the encapsulation material. Thus, some regions of the power package like the vicinity of chips or terminals are clearly more critical with respect to specific requirements like mechanical and thermo-mechanical behaviour or dielectric strength of the encapsulation material than other package parts.

According to the described semiconductor power module in order to improve the mechanical behaviour the encapsulation realized by the resin body is made by the use of two or more mold compounds or other resin materials like potting resin with different material properties for the encapsulation. Several types of resin material can be chosen with respect to specific local requirements according to the predetermined formation of the first, second and/or third resin element.

It is a further recognition in connection with the present disclosure that the implementation of several resin materials in one large package body may cause additional issues. When preparing a large package body from two or more different mold compounds or resin materials by transfer molding or other processes like potting, the sections of these different materials will adhere together, for example. Especially, if several parts of different resin or mold materials are arranged in lateral direction and adhere to each other, strong mechanical or thermo-mechanical stress will be present in the sealed resin body. Such a stress especially occurs on the interfaces of the different material sections and may result in a strong bow of the package body or may even provide mechanical damage to the encapsulation, e.g. voids or cracks, or even cause damages of the package interior after the manufacturing process.

By use of the described structure of the semiconductor power module and the intentionally introduced recesses it is possible to prevent or at counteract these adverse effects, at least. The formed recess between two adjacent resin elements enables to suppress or at least to reduce the stress occurring in a large resin sealed package body consisting of several materials, for example.

Additionally, the thermo-mechanical behaviour of the resin body and the semiconductor power module as a whole can be improved in view of its module operation, e.g. during thermal cycling.

According to an embodiment, a semiconductor device, comprises an embodiment of the described semiconductor power module which further includes one or more terminal connections coupled to the leadframe or substrate, and electronics which is coupled with at least one of the terminal connections.

The semiconductor power device can further comprise a heat sink which is coupled with the leadframe or substrate to dissipate heat during operation. Moreover, the semiconductor power device can comprise two or more embodiments of the aforementioned semiconductor power module. The electronics may include chips, integrated circuits and/or other discrete devices.

According to an embodiment, a method for manufacturing an embodiment of the described semiconductor power module comprises providing a leadframe or substrate, and forming a resin body coupled to the leadframe or substrate, wherein the resin body includes at least a first resin element and a second resin element and a resin material of the first resin element is different from a resin material of the second resin element. The first resin element and the second resin element are formed such that they are separated in part at least with respect to surface areas facing each other by means of a recess.

The forming the resin body can comprise providing a substance in terms of a mold compound resin, and applying the provided substance on the leadframe or substrate and thereby forming at least one of the first resin element or the second resin element by means of molding. The molding process can include transfer molding, injection molding and/or compression molding.

Alternatively, the forming the resin body can comprise providing a substance in terms of a potting resin, and applying the provided substance on the leadframe or substrate and thereby forming the first resin element and/or the second resin element by means of potting. Alternatively, one or more resin elements can be formed by means of potting and the other one or more resin elements can be formed by means of molding.

The recess between two resin elements can be formed in terms of a predetermined spacing between these elements or their interface areas. Thus, a recess formed as a penetrating gap or as a partial groove can be given due to a specific manufacturing tool during molding or potting the resin elements, for example.

According to a further embodiment of the method, the forming the resin body comprise subsequent formation of the at least one recess. Thus, forming the recess in terms of a penetrating gap or a groove can be done mechanically by means of at least one of cutting, sawing and/or milling subsequent to the forming of the first resin element and the second resin element. Alternatively, forming the recess can be done thermally by means of laser cutting. Alternatively, forming the recess can be done thermally by means of laser cutting. Alternatively, forming the recess can be done chemically by means of etching. The aforementioned forming processes can also comprise the forming of one recess by means of laser cutting and another recess by means of etching, for example.

As a result of that the described semiconductor power device and the described manufacturing method comprise or are related to produce an embodiment of the semiconductor power module, described features and characteristics of the semiconductor power module are also disclosed with respect to the semiconductor power device and the manufacturing method and vice versa.

Figure 2:
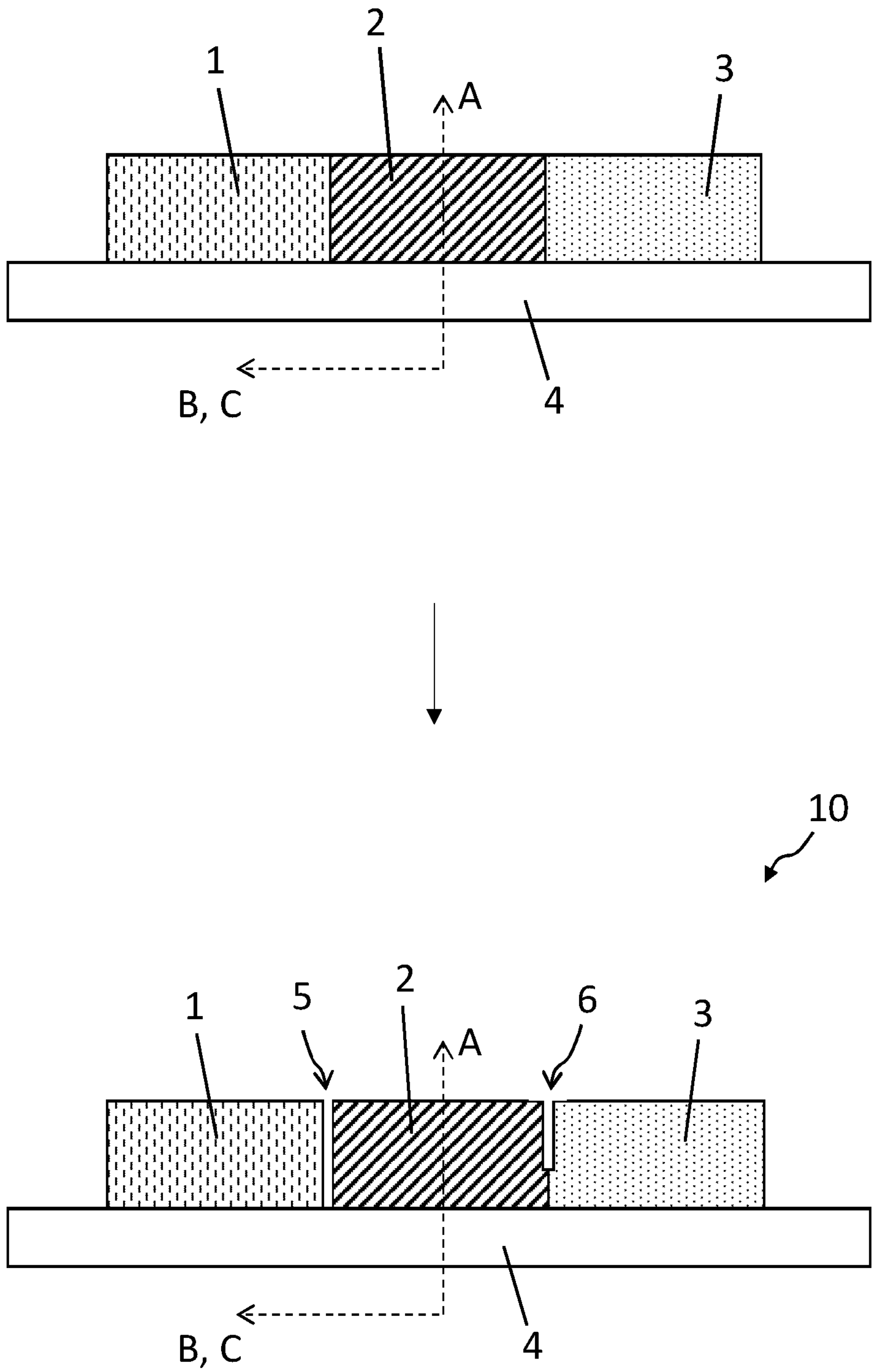
Figure 3:
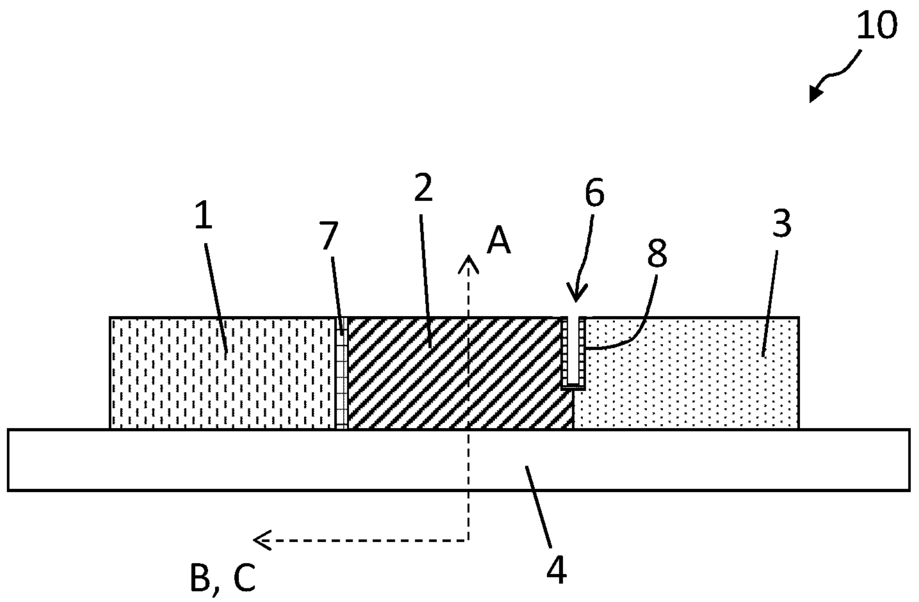
Figure 4:
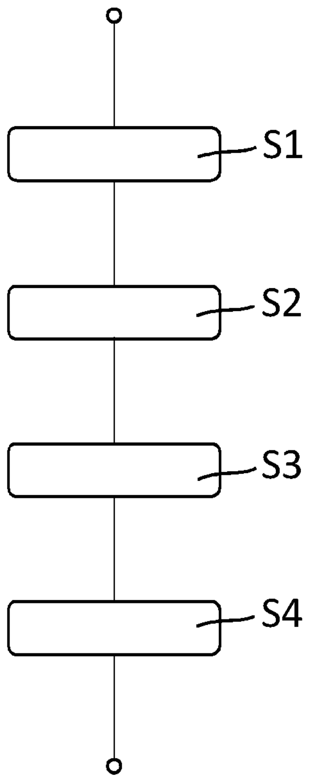

Exemplary embodiments are explained in the following with the aid of schematic drawings and reference numbers. The figures show:

FIG. 1 an embodiment of a semiconductor power module in a perspective view;

FIG. 2 manufacturing positions of manufacturing an embodiment of the semiconductor power module in a respective side view;

FIG. 3 a further embodiment of the semiconductor power module in a side view; and FIG. 4 flow chart for a method for manufacturing an embodiment of the semiconductor power module.

The accompanying figures are included to provide a further understanding. It is to be understood that the embodiments shown in the figures are illustrative representations and are not necessarily drawn to scale. Identical reference numbers designate elements or components with identical functions. In so far as elements or components correspond to one another in terms of their function in the figures, the description thereof is not repeated for each of the following figures. For the sake of clarity elements might not appear with corresponding reference symbols in all figures possibly.

FIG. 1 illustrates a perspective view of an embodiment of a semiconductor power module 10 for a semiconductor device. The semiconductor power module 1 comprises a leadframe or substrate 4 and a resin body that is coupled to the leadframe or substrate 4. The resin body forms an enclosure for electronics and includes at least a first resin element 1 and a second resin element 2. A resin material of the first resin element 1 is different from a resin material of the second resin element 2 and the resin elements 1 and 2 are configured such that they are separated in part at least with respect to surface areas facing each other by means of a recess.

The semiconductor power module 10 further comprises a plurality of first terminal connections 11 and second terminal connections 12 enabling electrical access to the electronics embedded or covered by the resin body. The terminal connections 11 and 12 are coupled to the leadframe or substrate 4. The electronics may include chips, integrated circuits and/or other discrete devices. A main plane of extent of the semiconductor power module 10 is spanned by lateral directions B and C which are orientated perpendicular with respect to each other and with respect to a stacking direction A (see FIGS. 2 and 3).

FIG. 2 shows in respective side views manufacturing positions for manufacturing an embodiment of the semiconductor power module 10. Steps of a corresponding manufacturing method can follow the flow chart as shown in FIG. 4. In a step S1 the leadframe or substrate 4 is provided.

In a step S2 the resin body is formed and coupled to the leadframe or substrate 4. The resin body according to FIG. 2 includes three resin elements, the first resin element 1, the second resin element 2 and a third resin element 3. All resin elements 1, 2, 3 comprise different resin material. As shown in the upper part of FIG. 2 the resin elements 1, 2 and 3 are formed adjacent to one another with respect to the lateral direction B, C.

In view of this, it is a recognition of the present disclosure that, if several parts of different resin materials are arranged next to each other they can adhere to each other and cause mechanical or thermo-mechanical stress in the sealed resin body. Such a stress especially occurs on the interfaces or surface areas of the resin elements 1, 2 and 3 facing each other. According to the upper part of FIG. 2 this would apply the interface between the first and the second resin elements 1 and 2 and between the second and the third resin elements 2 and 3.

In order to prevent a bow of the semiconductor power module 10 or even mechanical damages to the encapsulation of the resin body, e.g. voids or cracks, in a step S3 a respective recess is specifically introduced between the adjacent resin elements 1, 2 and 3 to reduce the contact areas and to form stress relief structures. Such a recess can be formed as a penetrating gap 5, as shown between the first and the second resin elements 1 and 2, or as a groove 6, as shown between the second and the third resin elements 2 and 3 (see the lower part of FIG. 2, which illustrates the concept of implementation of the gap 5 and the groove 6 on resin material borders). The gap 5 extends up to an upper surface of the leadframe or substrate 4 such that the entire surface areas facing each other are separated from each other. The groove 6 is formed such that a predetermined portion of the surface areas facing each other are separated from each other.

Additionally, in a step S4 the gap 5 can be filled with a given filling 7 and/or the groove 6 can be coated with a given coating 8 to further contribute to reduced mechanical stress and to improved functionality and module life of the semiconductor power module 10 (see FIG. 3).

The step S2 of forming the resin body can comprise providing a substance in terms of a mold compound resin, and applying the provided substance on the leadframe or substrate 4 and thereby forming one or more of the first resin element 1, the second resin element 2 and the third resin element 3 by means of molding.

Alternatively, the step S2 can comprise providing a substance in terms of a potting resin, and applying the provided substance on the leadframe or substrate 4 and thereby forming one or more of the first resin element 1, the second resin element 2 and the third resin element 3 by means of potting.

The step S3 of forming one or more recesses between the resin elements 1, 2 and 3 can comprise mechanical forming of the gap 5 and/or the groove 6 by means of cutting, sawing and/or milling. Alternatively or additionally, the step S3 can comprise thermal forming of the gap 5 and/or the groove 6 by means of laser cutting. Alternatively or additionally, the step S3 can comprise chemical forming of the gap 5 and/or the groove 6 by means of etching.

The use of two or more mold compounds or other resin types with different material properties are introduced for the encapsulation of large resin sealed power packages, for example. Consequently, several types of mold compounds or other resin types like potting resin can be chosen with respect to specific local requirements of the resin elements 1, 2 and 3. The manufacturing of a resin sealed semiconductor power module 10 having a resin body made from different mold compounds and/or other resin materials can be done in a sequential manufacturing process of two or more process steps basing transfer molding and/or other encapsulation techniques like potting.

To reduce the mechanical and thermo-mechanical stress occurring to the resin body consisting of several sections of different resin materials, the resin elements 1, 2 and 3 are mechanically, thermally and/or chemically separated from each other in part, at least.

There can be gaps 5 used as stress relief structures introduced at the interfaces of the different laterally arranged resin elements 1, 2 and 3. These gaps 5 may be available along a complete border between to two resin elements 1, 2 and 3. Alternatively, the recess can be formed to realize the groove 6 to implement a partly separation between two resin elements 1, 2 and 3. A depth of the gap 5 implemented for stress relief may have a depth according to the full thickness of the resin body, or a smaller depth may be applied. The implementation may be realized by different possible manufacturing methods.

The different resin elements 1, 2 and 3 are typically laterally arranged on the leadframe or substrate 4. Alternatively, the resin elements 1, 2 and 3 can be arranged on a substrate, or on a baseplate. The resin elements 1, 2 and 3 may comprise thermosetting resin or potting resin with different material properties, respectively. Consequently, some resin elements 1, 2 and 3 may be prepared by other manufacturing processes instead of transfer molding, for example. So, the second resin element 2 in the centre of the resin body may be prepared from potting resin after preparing the outer first and third resin elements 1 and 3 by transfer molding similar to a dam-and-fill process, for example.

However, the single resin elements 1, 2 and 3 comprising different materials are at least partly separated from each other by the intentionally implemented gap 5 or groove 6. A width of the gap 5 and/or the groove 6 may be in the range of 0.5 mm or more with respect to the lateral direction B and/or C. Thus, the gap 5 or the groove 6 can also extend in part along the lateral direction B and in part along the lateral direction C forming an L-shape with respect to a top view along the stacking direction A, for example. To improve a tightness of the resin body and the semiconductor power module 10 against humidity or hazardous gases, the introduced gap 5 or groove 6 may be filled or coated by an elastic and/or protective material, e.g. water repellent material.

According to an embodiment of the semiconductor power module 10 the resin body and the resin elements 1, 2 and 3 may consist only of different mold compounds or only different potting compounds, or it can be alternatively consist of different material types. Furthermore, resin materials for forming the respective resin element 1, 2 or 3 can be chosen in view of material properties and mechanical properties like adhesion of mold compound and/or filler material. Electrical properties of the resin materials can also be taken into account like filling by varistors, dielectric strength, dielectric constant, or comparative tracking index (CTI value). Alternatively or additionally, the resin material can be chosen in view of protective properties like improved humidity protection or protection against hazardous gases or chemical inertness.

The described structures and embodiments of the resin body enables a preparation of a relative large resin sealed semiconductor power module 10. Basing on the local requirements, the locally optimum resin materials for the planned resin elements 1, 2 and 3 can be chosen. The implementation of the described stress relief structures contributes to a reduced mechanical and thermo-mechanical stress and consequently in a reduced bow of the resin body. Moreover, the semiconductor power module 10 can comprise one or more of the following advantages:

Improved handling in manufacturing process

Improved yield in manufacturing process

Higher module lifetime in operation because of improved reliability with respect to thermal cycles Improved thermal interface behaviour due to reduced substrate or baseplate or leadframe bow Less issues in implementation of corresponding power packages to customer application, e.g. leak-tight mounting of the semiconductor power module 10 with pin-fin baseplate to cooler for liquid cooling.

The embodiments shown in or described by the FIGS. 1 to 4 as stated represent exemplary embodiments of the improved semiconductor power module 10 and the manufacturing method for; therefore, they do not constitute a complete list of all embodiments. Actual arrangements and methods may vary from the embodiments shown in terms of semiconductor power modules, for example.

REFERENCE SIGNS

1 first resin element
2 second resin element
3 third resin element
4 leadframe/substrate
5 penetrating gap
6 groove
7 filling
8 coating
10 semiconductor power module
11 first terminal connections
12 second terminal connections
A stacking direction
B lateral direction
C lateral direction
S(i) steps of a method for manufacturing a semiconductor power module

The invention claimed is:

1. A semiconductor power module, comprising:

a leadframe or substrate; and a resin body coupled to the leadframe or substrate including at least a first resin element and a second resin element, wherein the first and second resin elements are arranged laterally adjacent to each other with respect to a lateral direction of the semiconductor power module and wherein a resin material of the first resin element is different from a resin material of the second resin element and wherein the first resin element and the second resin element are separated in part at least with respect to surface areas facing each other by a recess in form of a groove formed directly in the resin material of at least one of the first resin element or the second resin element providing at least a partial free space between the first and second resin elements.

2. The semiconductor power module according to claim 1, wherein at least one of the resin material of the first resin element or the resin material of the second resin element comprises a thermosetting resin.

3. The semiconductor power module according to claim 1, wherein at least one of the resin material of the first resin element or the resin material of the second resin element comprises a potting resin.

4. The semiconductor power module according to claim 1, wherein the recess is formed as a penetrating groove such that an entire surface areas facing each other are separated from each other.

5. The semiconductor power module according to claim 4, wherein at least one of the penetrating groove or the recess has a width of 0.5 mm or more with respect to a lateral direction of the semiconductor power module.

6. The semiconductor power module according to claim 4, comprising a filling or a coating inside of the penetrating groove.

7. The semiconductor power module according to claim 1, wherein the resin body further comprises a third resin element with a resin material that is different from the resin material of at least one of the first resin element or the second resin element and wherein the first resin element, the second resin element and the third resin element all are separated in part at least with respect to surface areas facing each other by a recess respectively.

8. The semiconductor power module according to claim 1, further including terminal connections coupled to the leadframe or substrate, and electronics which is coupled with at least one of the terminal connections.

9. A method for manufacturing a semiconductor power module, the method comprising:

providing a leadframe or substrate, and forming a resin body coupled to the leadframe or substrate, wherein the resin body includes at least a first resin element and a second resin element, wherein the first and second resin elements are arranged laterally adjacent to each other with respect to a lateral direction of the semiconductor power module, wherein a resin material of the first resin element is different from a resin material of the second resin element, and wherein the first resin element and the second resin element are separated in part at least with respect to surface areas facing each other by a recess in form of a groove formed directly in the resin material of at least one of the first resin element or the second resin element providing at least a partial free space between the first and second resin elements.

10. The method according to claim 9, wherein the forming of the resin body comprises:

providing a substance in the form of a mold compound resin, and applying the provided substance on the leadframe or substrate and thereby forming the first resin element and/or the second resin element by transfer molding, injections molding and/or compression molding.

11. The method according to claim 9, wherein the forming the resin body comprises:

providing a substance in the form of a potting resin, and applying the provided substance on the leadframe or substrate and thereby forming at least one of the first resin element or the second resin element by potting.

12. The method according to claim 9, wherein the forming the resin body comprises:

mechanically forming the recess in the form of a penetrating groove or a groove by at least one of cutting, sawing or milling subsequent to the forming of the first resin element and the second resin element.

13. The method according to claim 9, wherein the forming the resin body comprises:

thermally forming the recess in the form of a penetrating groove or a groove by laser cutting subsequent to the forming of the first resin element and the second resin element.

14. The method according to claim 9, wherein the forming the resin body comprises:

chemically forming the recess in the form of a penetrating groove or a groove by etching subsequent to the forming of the first resin element and the second resin element.

15. The semiconductor power module according to claim 1, wherein the recess forms a stress relief structure configured to reduce mechanical and thermo-mechanical stress in the resin body.

16. The semiconductor power module according to claim 1, comprising a filling or a coating inside the recess, wherein the filling or coating comprises an elastic and/or protective material.

17. The semiconductor power module according to claim 1, wherein the semiconductor power module is configured for use in high voltage power module applications for a voltage of at least 0.5 kV.

18. The semiconductor power module according to claim 1, wherein the recess is formed as a groove such that a predetermined portion of the surface areas facing each other are separated from each other while a remaining portion of the surface areas are in contact with each other.

19. The semiconductor power module according to claim 1, wherein the first resin element comprises a potting resin and the second resin element comprises a thermosetting resin prepared by transfer molding.

20. A method for manufacturing a semiconductor power module, the method comprising:

providing a leadframe or substrate; and forming a resin body coupled to the leadframe or substrate, wherein the resin body includes at least a first resin element and a second resin element, wherein the first and second resin elements are arranged laterally adjacent to each other with respect to a lateral direction of the semiconductor power module, wherein a resin material of the first resin element is different from a resin material of the second resin element, wherein the first resin element and the second resin element are separated in part at least with respect to surface areas facing each other by a recess in form of a groove providing at least a partial free space between the first and second resin elements, and wherein the forming the resin body comprises one of:

mechanically forming the recess in the form of a penetrating groove or a groove by at least one of cutting, sawing or milling subsequent to the forming of the first resin element and the second resin element;

thermally forming the recess in the form of a penetrating groove or a groove by laser cutting subsequent to the forming of the first resin element and the second resin element; or chemically forming the recess in the form of a penetrating groove or a groove by etching subsequent to the forming of the first resin element and the second resin element.

* * * * *